(12) United States Patent
Reiner

(10) Patent No.: US 7,333,356 B2
(45) Date of Patent: Feb. 19, 2008

(54) ONE-TIME PROGRAMMABLE MEMORY DEVICES

(75) Inventor: Joachim Christian Reiner, Kilchberg (DE)

(73) Assignee: NXP B.V., Eindhoven (NL)

( * ) Notice: Subject to any disclaimer, the term of this patent is extended or adjusted under 35 U.S.C. 154(b) by 130 days.

(21) Appl. No.: 10/538,288

(22) PCT Filed: Dec. 3, 2003

(86) PCT No.: PCT/IB03/05621

§ 371 (c)(1),
(2), (4) Date: Jun. 10, 2005

(87) PCT Pub. No.: WO2004/053886

PCT Pub. Date: Jun. 24, 2004

(65) Prior Publication Data

US 2006/0056222 A1    Mar. 16, 2006

(30) Foreign Application Priority Data

Dec. 12, 2002 (EP) ................................. 02102734

(51) Int. Cl.
*G11C 17/00* (2006.01)
(52) U.S. Cl. ................... 365/104; 365/185.18
(58) Field of Classification Search ........ 365/104, 365/185.18
See application file for complete search history.

(56) References Cited

U.S. PATENT DOCUMENTS

| | | | | |
|---|---|---|---|---|
| 5,257,225 A | * | 10/1993 | Lee | 365/185.19 |
| 5,652,722 A | * | 7/1997 | Whitefield | 365/185.23 |
| 5,781,489 A | * | 7/1998 | Okamoto | 365/208 |
| 5,943,264 A | * | 8/1999 | Fournel et al. | 365/185.18 |
| 6,034,890 A | | 3/2000 | Satoh | |
| 6,298,459 B1 | * | 10/2001 | Tsukamoto | 714/746 |

* cited by examiner

*Primary Examiner*—Michael T Tran

(57) ABSTRACT

The invention relates to a one-time programmable memory device. In order to make such a memory device particular simple and reliable, it is proposed that the device comprises a MOS selection transistor T1 and a MOS memory transistor T2 connected in series between a voltage supply line BL and ground Gnd. The device further comprises programming means for applying predetermined voltages Vsel, Vctrl, Vprog to the gate of the selection transistor T1, to the gate of the memory transistor T2 and to the voltage supply line BL. The applied voltages Vsel, Vctrl, Vprog are selected such that they force the memory transistor T2 into a snap-back mode resulting in a current thermally damaging the drain junction of the memory transistor T2. The invention relates equally to a corresponding method for programming a one time programmable memory.

19 Claims, 1 Drawing Sheet

ONE-TIME PROGRAMMABLE MEMORY DEVICES

Figure 1:
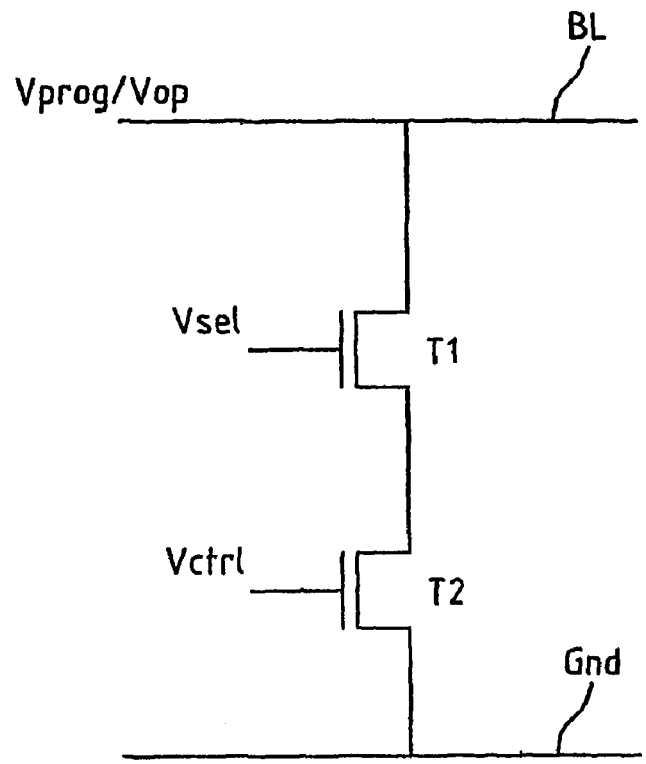

The invention relates to a one-time programmable (OTP) memory device and to a method for programming a one-time programmable memory device.

An OTP memory constitutes a non-volatile storage element which preserves an information even if a power supply is turned off. Conventional OTP memories have a structure which differs from the structures used in conventional CMOS (complementary metal-oxide semiconductor) technology. Thus, they require modifications or expensive extra processing steps in wafer fabrication when they are to be integrated with CMOS circuitry.

In document U.S. Pat. No. 5,943,264, an approach for realizing an OTP memory device in standard CMOS technology is presented. Here, an NMOS (N-channel metal-oxide semiconductor) transistor is connected in series with a PN junction, which PN junction functions as memory. The memory is programmed by fusing the PN junction. To this end, the transistor is brought into a so-called snap-back mode, which is achieved when the drain-source voltage reaches a specific breakdown voltage. In the snap-back mode, the current gain of the transistor is very high and its series resistance is very low. Thereby, the transistor is able to provide a high current suited to fuse the PN junction, even in case the transistor is rather small. This approach has the disadvantage, however, that the transistor itself might be damaged in the snap-back mode. It is therefore proposed that additional programming current limitation means are provided to prevent the destruction of the transistor.

It is an object of the invention to provide a particularly simple and reliable alternative for programming a one-time programmable memory.

This object is reached according to the invention with an OTP memory device comprising a MOS selection transistor and a MOS memory transistor connected in series between a voltage supply line and ground. The device further comprises programming means for applying predetermined voltages to the gate of the selection transistor, to the gate of the memory transistor and to the voltage supply line, which applied voltages force the memory transistor into a snap-back mode resulting in a current thermally damaging the drain junction of the memory transistor.

The object of the invention is equally reached with a corresponding method for programming an OTP memory device comprising a MOS selection transistor and a MOS memory transistor connected in series between a voltage supply line and ground.

The invention proceeds from the idea that if a MOS transistor is employed as memory, this memory transistor can be programmed by being brought itself into a snap-back mode, in which a drain junction of the transistor is thermally damaged. Thereby, the OTP memory device can be programmed without the necessity to apply voltages exceeding the snap-back holding voltage of the process technology.

It is an advantage of the invention that the employed memory element can be programmed without stressing a selection transistor providing the current for programming the memory transistor.

The invention provides a low-cost option for OTP memory applications which are based on CMOS technology. No changes of the CMOS fabrication process are required.

Preferred embodiments of the invention become apparent from the dependent claims.

Advantageously, the memory transistor is forced into the snap-back mode by ramping down the voltage which is first applied to the gate of the memory transistor.

Thereby, the effectiveness of the drain fusing mechanism is increased, which limits the required size of the selection transistor.

The employed memory transistor should be rather small in order to keep the required programming current low, while the selection transistor has to be large enough to provide the required programming current to the memory transistor. The required programming current can be about 10 mA, but varies with the used technology. Due to the required size of the selection transistor, the invention is particularly suited for applications which only require a small number of bits to be stored.

The memory device preferably meets a variety of requirements which ensure a sufficient reliability of the memory device. Such requirements comprise ESD (electrostatic discharge) robustness, latch-up robustness, minimal decoder and selection transistor degradation, data retention of non-programmed cells and data retention of programmed cells.

ESD stress, which usually occurs during the handling of a device when no power supply is connected to it, might fuse memory transistor drains in case no specific protection is provided. In a preferred embodiment of the invention, therefore an RC unit is implemented in the memory device. The RC time constant of this unit ensures that a voltage applied to the gate of the selection transistor and a voltage applied to the gate of the memory transistor are low during a time period exceeding the usual duration of an ESD event when the memory device is powered up. That is, the gates of these transistors will remain grounded with a timer period of e.g. 10 ms after powering the memory device up, which ensures that a high voltage occurring at a programming pad of the programming means during an ESD event will not reach the memory transistor. Thus, the proposed embodiment of the invention provides an effective protection against ESD stress.

A latch-up, in contrast, may occur during normal operation when the device is powered up. More specifically, there is a risk that an external overvoltage pulse will activate the programming mode of the OTP memory device. Therefore, a mechanism should be provided which actively switches the programming current path off during normal operation. In a preferred embodiment of the invention, such a mechanism is given by a sufficiently complex setup procedure for activating the programming mode, which ensures with a sufficiently high probability that a single external overvoltage pulse will not activate the programming mode.

In an equally preferred embodiment of the invention, a programming voltage level above the normal operation voltage level is used, in order to keep the cell size reasonably small. High voltage levels may result in a degradation of the memory device due to an increased heating of the carrier. Hot carrier effects occur e.g. in strong pinch-off conditions in a transistor, which in turn occur with a high drain voltage and a moderate to low gate voltage at the transistor. It has thus to be ensured that no intolerable degradation of the memory circuitry occurs due to the proposed high programming voltage. Hot carrier conditions resulting in a degradation, however, are avoided effectively with the proposed programming cycle comprising a ramping down of the voltage applied to the gate of the memory transistor.

The memory transistor should moreover be designed such that it can withstand the normal supply voltage, e.g. the voltage applied for a memory readout, without being damaged, in order to ensure data retention of a non-programmed memory transistor.

The programming of the memory transistor results in a leakage in the transistor, which can be detected in the form of a leakage current in a subsequent readout. It should be ensured in the readout that a detected leakage is indeed caused by a hard drain fusing which results in a damage connecting the drain with the source diffusion, not only by an ESD-induced soft drain junction damage which may reduce over time. As the leakage currents resulting from hard drain junction fusing are in the mA range, while those resulting from soft damage are in the μA range, they can easily be distinguished by setting a proper current detection limit for the readout.

The invention is particularly suited to be employed in any product which is designed in a CMOS technology and which requires a low-bit memory, for example in watch ICs using an OTP memory for an adjustment of some oscillator frequency, in display driver chips using an OTP memory for an adjustment of voltage levels, etc.

Figure 2:
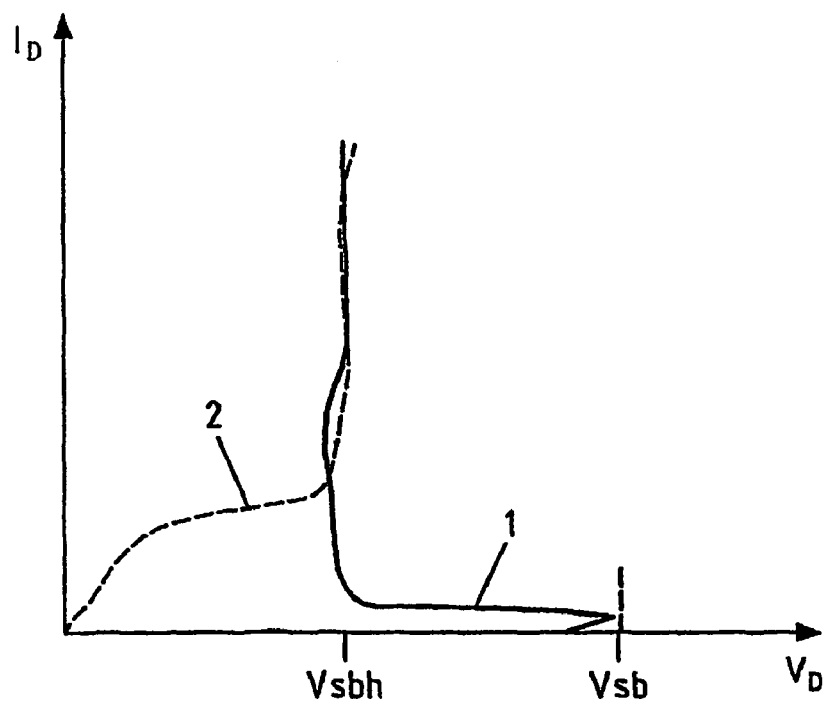

Other objects and features of the present invention will become apparent from the following detailed description considered in conjunction with the accompanying drawings, wherein FIG. 1 schematically illustrates a memory cell of a memory device according to the invention; and FIG. 2 is a diagram illustrating the snap-back mode of an NMOS transistor.

FIG. 1 shows an OTP memory cell forming part of a CMOS memory device according to the invention. The memory cell comprises a selection transistor T1 and a memory transistor T2. Both transistors T1, T2 are NMOS transistors. The drain of the selection transistor T1 is connected to a bit line BL and the gate of the selection transistor T1 is connected to a voltage supply (not shown) providing a voltage Vsel. The source of the selection transistor T1 is connected to the drain of the memory transistor T2, while the source of the memory transistor T2 is connected to ground Gnd. The gate of the memory transistor T1 is connected to a voltage supply (not shown) providing a voltage Vctrl.

In a non-programmed state of the memory cell, the drain junction of the memory transistor T2 is intact, while in a programmed state of the memory cell, the drain junction of the memory transistor T2 is thermally damaged.

For programming a memory cell, the voltages Vsel and Vctrl applied to the gate of the selection transistor T1 and to the gate of the memory transistor T2, respectively, are set by programming means (not shown) to a voltage level predetermined for programming. The transistors T1, T2 are thus switched on. Further, a predetermined programming voltage Vprog is applied by the programming means to the bit line BL. The programming voltage Vprog is set to a level exceeding the allowed maximum operating voltage of the employed CMOS technology, but below the snap-back voltage of the employed CMOS technology.

As a result of the applied voltages Vsel, Vctrl and Vprog, a current flows through the memory cell, i.e. from bit line BL via selection transistor T1 and memory transistor T2 to ground Gnd. The transistors T1, T2 are dimensioned such that the major part of the voltage Vprog applied to the bit line BL is applied to the memory transistor T2. The selection transistor T1 is not required to be strong enough to provide a current to the memory transistor T2 which is sufficient to thermally damage the drain junction of the memory transistor T2 at this point of time.

In order to ensure that the drain junction of the memory transistor T2 is thermally damaged, the voltage Vctrl applied to the gate of the memory transistor T2 is now ramped down by the programming means. This forces the memory transistor T2 into a strong pinch-off and eventually into a snap-back mode, even though the drain-source voltage is below the snap-back voltage.

For illustration, FIG. 2 shows the drain current $I_D$ over the drain-source voltage $V_D$ of an NMOS transistor. A first curve 1 indicates the behavior of the transistor for the case that the gate of the transistor is grounded. It can be seen that the transistor switches back, or snaps back, at the voltage Vsb and goes into a high-current mode at a lower snap-back holding voltage Vsbh. When the gate of the transistor is turned on, the transistor passes on directly to the high-current mode at snap-back holding voltage Vsbh without having to reach first the snap-back voltage Vsb. This is indicated in FIG. 2 with a second curve 2. Thereby, the power dissipation is concentrated even further into the drain junction of the transistor, which provides an effective drain junction fusing mechanism.

Ramping down the voltage Vctrl which is applied to the gate of the memory transistor T2 further increases the effectiveness of the drain fusing mechanism.

A subsequent readout of the memory transistor T2 is performed by readout means (not shown) sensing a leakage current in the memory cell.

To this end, the readout means apply an operating voltage Vop to the bit line BL. Moreover, the voltage Vsel applied to the selection transistor T1 is set high, while the voltage Vctrl applied to the gate of the memory transistor T2 is set low. That is, the selection transistor T1 is turned on with a gate-voltage predetermined for the readout, while the memory transistor T2 is not turned on.

In case the memory cell is not programmed, basically no current will flow through the cell, since the memory transistor T2 is intact and turned off. If the cell is programmed, in contrast, a current should flow through the cell even though the memory transistor T2 is turned off, since the fused drain junction of the memory transistor T2 allows a leakage current to pass.

The amount of a current flow detected by a sensing circuitry of the reading means can thus be used as a criterion for determining whether the cell has to be considered to be programmed or not. A cell with a detected current lying below a predetermined detection level is considered not to be programmed, whereas a cell with a detected current lying above a predetermined detection level is considered to be programmed.

Experiments have shown that drain fusing occurs without an additional gate oxide breakdown with a certainty level of 90%. But even in case the gate oxide of a programmed memory transistor has broken down, this cell will still allow a leakage current and be considered as programmed. Therefore, the proposed memory is insensitive to gate oxide breakdown in a programmed cell.

A plurality of memory cells corresponding to the memory cell described with reference to FIG. 1 can be combined in a memory cell array. The memory cell area is dominated by the size of the selection transistor and its guard ring. Such a guard ring is required to assure a sufficient ESD robustness of the memory cell. The space requirement for the selection transistor can be assumed to be about 20 μm×8.2 μm 164 μm², and the space requirement for the memory transistor can be assumed to be about 8 μm×8 μm=64 μm², resulting in an estimated cell size of about 220 μm². A 32-bit memory cell array would thus require an area of 7040 μm² or e.g. 70

μm×100 μm. To this area, the area required for a multiplexer circuitry taking care of programming and reading out the different cells has to be added.

It is to be noted that the presented embodiment constitutes only a selected embodiment of the invention which can be varied in many ways. In particular, suitable protection mechanisms protecting a memory cell from an undesired programming can provided.

The invention claimed is:

1. One-time programmable memory device comprising an MOS (metal-oxide semiconductor) selection transistor and an MOS memory transistor connected in series between a voltage supply line and ground, and further comprising programming means for applying voltages to a gate of said selection transistor, to a gate of said memory transistor and to said voltage supply line, which applied voltages force said memory transistor into a snap-back mode resulting in a current thermally damaging a drain junction of said memory transistor, wherein said programming means comprise means for first applying a predetermined voltage to said gate of said memory transistor and for then ramping down said predetermined voltage applied to said gate of said memory transistor until said memory transistor enters said snap-back mode.

2. One-time programmable memory device according to claim 1, wherein said MOS transistors are NMOS (N-channel metal-oxide semiconductor) transistors.

3. A one-time programmable memory device according to claim 2, further comprising at least one resistor-capacitor unit arranged between a voltage supply and said gate of said selection transistor and between a voltage supply and said gate of said memory transistor, said resistor-capacitor unit ensuring that a predetermined voltage is applied to said gate of said selection transistor and said gate of said memory transistor at the earliest a predetermined time after powering up said one-time programmable memory device.

4. A one-time programmable memory device according to claim 2, wherein said programming means require a setup procedure for initiating their operation, which setup procedure comprises more steps than applying one predetermined voltage level to said programming means.

5. A one-time programmable memory device according to claim 2, wherein said programming means apply a programming voltage to said voltage supply line which is higher than a voltage applied to said voltage line for other operations than thermally damaging a drain junction of said memory transistor.

6. One-time programmable memory device according to claim 1, further comprising at least one resistor-capacitor unit arranged between a voltage supply and said gate of said selection transistor and between a voltage supply and said gate of said memory transistor, said resistor-capacitor unit ensuring that a predetermined voltage is applied to said gate of said selection transistor and said gate of said memory transistor at the earliest a predetermined time after powering up said one-time programmable memory device.

7. One-time programmable memory device according to claim 1, wherein said programming means require a setup procedure for initiating their operation, which setup procedure comprises more steps than applying one predetermined voltage level to said programming means.

8. One-time programmable memory device according to claim 1, wherein said programming means apply a programming voltage to said voltage supply line which is higher than a voltage applied to said voltage line for other operations than thermally damaging a drain junction of said memory transistor.

9. One-time programmable memory device according to claim 1, further comprising readout means for applying a high voltage to said gate of said selection transistor, for applying a low voltage to said gate of said memory transistor, for applying a readout voltage to said voltage supply line, for detecting a current through said transistors resulting with said applied voltages, for comparing said detected current with a predetermined current value, and for providing an indication that said memory transistor is programmed in case it is determined that said detected current exceeds said predetermined current value.

10. One-time programmable memory device according to claim 1 comprising a plurality of memory cells, each of said memory cells including a respective selection transistor and a respective memory transistor connected in series between said voltage supply line and ground, wherein said programming means are suited to apply voltages to said memory cells forcing any selected one of said memory transistors into a snap-back mode resulting in a current thermally damaging a drain junction of the respective memory transistor.

11. CMOS circuitry comprising a one-time programmable memory device according to claim 1.

12. A one-time programmable memory device according to claim 1, wherein said MOS transistors are NMOS (N-channel metal-oxide semiconductor) transistors.

13. A one-time programmable memory device according to claim 1, further comprising at least one resistor-capacitor unit arranged between a voltage supply and said gate of said selection transistor and between a voltage supply and said gate of said memory transistor, said resistor-capacitor unit ensuring that a predetermined voltage is applied to said gate of said selection transistor and said gate of said memory transistor at the earliest a predetermined time after powering up said one-time programmable memory device.

14. A one-time programmable memory device according to claim 1, wherein said programming means require a setup procedure for initiating their operation, which setup procedure comprises more steps than applying one predetermined voltage level to said programming means.

15. A one-time programmable memory device according to claim 1, wherein said programming means apply a programming voltage to said voltage supply line which is higher than a voltage applied to said voltage line for other operations than thermally damaging a drain junction of said memory transistor.

16. Method for programming a one-time programmable memory, which memory comprises an MOS (metal-oxide semiconductor) selection transistor and an MOS memory transistor connected in series between a voltage supply line and ground, said method comprising applying voltages to a gate of said selection transistor, to a gate of said memory transistor and to said voltage supply line, which applied voltages force said memory transistor into a snap-back mode resulting in a current thermally damaging a drain junction of said memory transistor, wherein applying voltages to a gate of said selection transistor, to a gate of said memory transistor and to said voltage supply line comprises first applying a predetermined voltage to said gate of said memory transistor and then ramping down said predetermined voltage applied to said gate of said memory transistor until said memory transistor enters said snap-back mode.

17. One-time programmable memory device comprising an MOS (metal-oxide semiconductor) selection transistor and an MOS memory transistor connected in series between a voltage supply line and ground, and further comprising programming means for applying voltages to a gate of said selection transistor, to a gate of said memory transistor and to said voltage supply line, which applied voltages force said memory transistor into a snap-back mode resulting in a current thermally damaging a drain junction of said memory transistor and further comprising at least one resistor-capacitor unit arranged between a voltage supply and said gate of said selection transistor and between a voltage supply and said gate of said memory transistor, said resistor-capacitor unit ensuring that a predetermined voltage is applied to said gate of said selection transistor and said gate of said memory transistor at the earliest a predetermined time after powering up said one-time programmable memory device.

18. A one-time programmable memory device according to claim 17, wherein said programming means apply a programming voltage to said voltage supply line which is higher than a voltage applied to said voltage line for other operations than thermally damaging a drain junction of said memory transistor.

19. A one-time programmable memory device according to claim 17, wherein said programming means require a setup procedure for initiating their operation, which setup procedure comprises more steps than applying one predetermined voltage level to said programming means.

* * * * *